United States Patent [19]

Biwer et al.

[11] Patent Number: 5,581,491
[45] Date of Patent: Dec. 3, 1996

[54] HIGH-THROUGHPUT TESTING APPARATUS

[75] Inventors: Alfred Biwer, Ammerbuch; Pia Landgraf-Hirschka, Rottenburg; Marco Langhof, Magdeburg, all of Germany

[73] Assignee: Hewlett-Packard Company, Palo Alto, Calif.

[21] Appl. No.: 298,389

[22] Filed: Aug. 30, 1994

[30] Foreign Application Priority Data

Sep. 20, 1993 [EP] European Pat. Off. .............. 93115095

[51] Int. Cl.⁶ .................................................. G05B 19/00
[52] U.S. Cl. ............................ 364/580; 364/579; 371/27
[58] Field of Search ................................. 364/580, 579; 371/23, 27, 15.1, 24.1, 22.6; 395/100, 162, 500, 650; 324/73.1

[56] References Cited

U.S. PATENT DOCUMENTS

| | | | |
|---|---|---|---|
| 5,046,033 | 9/1991 | Andreasen et al. | 364/580 |
| 5,243,603 | 9/1993 | Broeren | 371/27 |
| 5,311,486 | 5/1994 | Alton et al. | 324/73.1 |
| 5,336,944 | 8/1994 | Fischer | 307/350 |
| 5,381,417 | 1/1995 | Loopik et al. | 371/15.1 |
| 5,410,681 | 4/1995 | Jessen et al. | 364/DIG. 1 |
| 5,453,995 | 9/1995 | Behrens | 371/27 |

FOREIGN PATENT DOCUMENTS

| | | |
|---|---|---|
| 0056895 | 8/1982 | European Pat. Off. . |
| 0541837 | 5/1993 | European Pat. Off. . |
| 0541840 | 5/1993 | European Pat. Off. . |
| 0541839 | 5/1993 | European Pat. Off. . |
| 3530308A1 | 2/1987 | Germany . |

OTHER PUBLICATIONS

A Combinational Board Test System, 1266 Hewlett–Packard Journal, 38 (1987) Dec., No. 11, Palo Alto, CA., USA pp. 53–57 Search Report (3 pages).

*Primary Examiner*—Emanuel T. Voeltz
*Assistant Examiner*—Hal D. Wachsman

[57] ABSTRACT

A testing apparatus for testing a multiplicity of electronic devices, in particular integrated circuits, comprises means for two-fold processing of symbolic test data. In one mode, a fast pass/fail test may be executed by data. In one mode, a fast pass/fail test may be executed by once transforming the pass/fail test-related symbolic data into executable data and downloading them into a test data memory. Repeated pass/fail tests may then be executed. In the second mode, the symbolic test data are transformed and downloaded every time the test is performed, which makes execution slower, but allows modification and value tests.

16 Claims, 6 Drawing Sheets

HIGH-THROUGHPUT TESTING APPARATUS

FIELD OF THE INVENTION

This invention relates to a testing apparatus for testing a multiplicity of electronic devices conveniently and at high speed. More specifically, the invention relates to a tester for integrated circuits, although it may also prove useful in related fields such as board testers, wafer testers etc.

BACKGROUND OF THE INVENTION

Electronic testing equipment, such as integrated circuit or board testers, has become more and more complex over the last decades. This is particularly due to the increased functionality of the circuitry to be tested—e.g., latest microprocessors, RISC CPU's, combined logic/memory IC's —, which calls for complex test procedures and high-sophisticated tester equipment.

There is also another aspect which has become important. Conventional technology provided two basically different groups of testers:

1. Research-oriented testing equipment, i.e., testers which allow easy modification of the test procedure for the purpose of testing individual devices at various different parameters—maximum test speed or throughput is not a concern for this kind of devices, and the focus is rather flexibility and easy access of the parameters to be tested; and 2. Production-oriented testing equipment which is was designed for maximum throughput, i.e., for a maximum number of devices to be tested in a given time frame (the time for testing should not exceed several seconds per device). Easy modification of test procedures was not a design goal for such kind of testing equipment.

However, there is also another difference between research-oriented and production-oriented testers which is of some importance for the present invention. This is the different manner in which the test is performed. Production-oriented testers are commonly designed to perform a test which is called "pass/fail test" (p/f test, sometimes also called "go/nogo test"). That is, a certain specification of the device is tested (say, it is operated at a supply voltage which is 20% lower than the nominal supply voltage), and this test is either passed or fails (it is understood that a multiplicity of similar tests are performed to test proper operation of a device; however, the lower limit of the supply voltage is only tested once, namely at nominal minus 20% voltage).

In contrast, in a research environment, the operator might not only want to know whether the device is operative at said lower limit, but the exact value at which the device fails. That is, in the above example, he would e.g. like to reduce the supply voltage in steps of 1% thereof, and finally find out at which level the device is no longer operative (say, at nominal minus 28% supply voltage, i.e., 72% of the nominal supply voltage). It is understood that this kind of test—often called "value test" in contrast to the "pass/fail test" —requires different test procedures, and is time-consuming, which makes it usually unsuited for use in a production environment.

However, there is still a need to transfer test procedures developed under research conditions one day to a production environment. Furthermore, there is an ongoing demand to use the same tester for research, as well as production purposes; that is, the difference between a research-type tester and a production-type tester is merely the tester program when high-sophisticated tester equipment is used.

Designers of tester equipment are thus faced with conflicting demands, namely to develop procedures suited for fast execution, i.e., designed for pass/fail tests, as well as procedures which permit easy modification and value tests.

One solution to this problem used in the past was to develop two programs simultaneously, namely a value test program for research purposes (herein also called "engineering program"), and a pass/fail test program (also "high-throughput program"), wherein the latter essentially performed the same steps as the engineering program, but did not contain the loops etc. necessary to perform a value test, and was further optimized for high throughput. Both programs commonly used different resources such as preprogrammed utilities, editing or other input means and often even different levels of program language.

The result of this solution was excellent, as the two programs were optimally adapted to their respective purposes. However, it will be understood that this procedure was not only extremely time-consuming and labor-intensive, but also error-prone, just as the complete engineering program had to be "transformed" into the production program manually, and any future modification, change or improvement of the engineering program had likewise to be transformed. Even if only a modification of the production program was required, the engineering program had to be modified first, just for the purpose of keeping the two programs equivalent to each other.

Another drawback of the prior art approach was the time required to transfer the program manually from the engineering level to the production level. It was not only the engineering resources bound by the transfer which annoyed the users of such testers, but also the delay in the production of new devices—as long as they could not be tested, they could not be delivered. Yet another problem was the immense amount of time necessary to debug the coexisting programs.

Yet another serious disadvantage of the known concept was that the "production program" had to be written in a low-level programming language, i.e., a language somewhat close to the functionality of the assigned hardware components. High-level languages, instructions and macros were not suited for this purpose, just because the overhead, and thus the increase in execution time, generally created by such languages.

Thus, there is a need for a testing apparatus of the kind mentioned above which fulfills at least one, but preferably multiple or all of the following characteristics:

a) A single instruction set, or program, should be provided which is suited to perform engineering tests, as well as production tests;

b) the program should be able to perform value tests, as well as pass/fail tests;

c) the program should be fast in the pass/fail mode, but still easy to modify;

d) the program should provide high-level tools, in contrast to the former approach of designing production programs, in order to make programming easier and faster.

The present invention fulfills these needs and provides other related advantages.

SUMMARY OF THE INVENTION

In general, the present invention relates to a testing apparatus for testing electronic devices—preferably, a multiplicity of electronic devices at high speed —, including a high-level program control device and at least one test data memory, said testing apparatus comprising:

(1) An input device for entering test data in at least partially symbolic form, said symbolic test data describing a value test, as well as a pass/fail test, (2) a transformation processor for transforming said symbolic test data into executable test data, (3) a test execution processor for performing tests using executable test data stored in said test data memory, wherein (4) the transformation processor transforms the part of said symbolic test data which relates to the pass/fail test into executable pass/fail test data before a test is started, (5) the testing apparatus retains the executable pass/fail test data generated by the transformation processor according to feature (4), as well as the original symbolic test data, (6) the test execution processor causes, in response to user instructions, either (6.1) execution of the executable pass/fail test data generated by the transformation processor according to feature (4), or (6.2) transformation and execution of the original symbolic test data during the test.

In order to get the full understanding of the present invention, it is first necessary to consider the basic structural components of an electronic device tester, such as an integrated circuit (IC) tester or board tester. In very general terms, an IC tester comprises a computer-like controller and a set of dedicated hardware components. These hardware components are adapted for high speed and precise functional testing of a device under test (DUT); e.g., the hardware components are designed to generate very fast and programmable transitions or certain patterns, measure the response of the DUT accurately etc. The most important elements of such tester-dedicated hardware components are the so-called "formatter", and the "comparator". Examples of such devices are e.g. disclosed in European Patent Applications EP-A-541 840 and EP-A-541 837.

However, the formatters and comparators constitute only one part of the tester-dedicated hardware. Yet another aspect is the provision of suitable test patterns, i.e., the entirety of test signals to be applied to the DUT. For reasons of testing speed and performance, these patterns have to be provided in a memory close to the DUT. The usual approach is a memory under control of a sequencer (which is essentially a counter feeding addresses to the memory. However, the sequencer provides more functionality than a common digital counter; e.g., it is able to perform conditional and unconditional branches, execute subroutines, stop operation etc.).

In a higher sophisticated approach, two memories are provided, namely a Vector Memory which holds waveform codes or action codes, and a Waveform Memory which "decodes" the waveform codes into actions to be performed with the DUT. Both memories are reprogrammable, such that the overall test sequence, as well as the specific actions assigned with each waveform code, may be altered during operation. This concept is disclosed in European Patent Application EP-A-541 8391 and in corresponding U.S. Pat. No. 5,453,995. Because of the importance of this U.S. Patent No., and as the present invention has been specifically designed to operate together with the tester-dedicated hardware components disclosed therein, it is hereby entirely incorporated by reference into the present disclosure.

The term "test data memory" as used in the claim language relates to memories of the kind discussed above. Although the preferred embodiment includes a Vector Memory as well as a Waveform Memory, it will be understood that the present invention also covers embodiments with a single tester-dedicated memory only.

In contrast to the above-discussed tester-dedicated hardware components, the controller or program control device is supported by high-level tools such as an operating system (e.g., UNIX®), an editor etc. This is because speed is not as critical as for the tester-dedicated hardware components. However, although most of its functionality is provided for off-line operation, the controller also includes components which are active during the test itself, i.e., in "on-line" mode or at run-time. This applies particularly for the so-called test executor or test execution processor, which is an entity controlling the flow of the overall test conditions. Suppose, for example, that the test data memory contains several vector sequences provided for various kinds of tests. The test execution processor then selects the correct vector sequence for a particular test, provides the sequencer with the corresponding start address etc. That is, the test execution processor is just the component which controls on-line operation of the tester-dedicated hardware.

Yet another component of the program control device is an input device for entering test data. This may be an interactive editor, a light pen, a graphics tablet or the like. In a preferred embodiment of the present invention, it is a graphical interactive editor which allows data entry in at least partially symbolic form. This has the particular advantage that the operator does not have to write program code, be it in a high- or low-level program language; instead, the operator may take advantage of utilities provided by the manufacturer of the tester, and the graphical interface is only provided to select the right constants and parameters.

If such high-level entry means are used (or even if the test sequence is defined in a high-level program language), then the test definitions need some kind of formal translation into the corresponding hardware pattern. This is why a transformation processor is provided as part of the program control device, wherein the transformation processor transforms the symbolic test data entered through the input device into executable test data.

A high-level description of the test procedure is particularly suited for performing value tests. This is because some parameters stored in the tester-dedicated hardware components have to be modified during the actual test. As an example, take a value test intended to measure the setup time of a data pin of a DUT. The test may, e.g., start with a setup time of 20 ns (i.e., the data signal at the pin under test is stable 20 ns prior to the occurrence of an active clock transition), and if the test is passed, then the setup time is reduced in 1 ns steps until the device fails. It will be understood that the hardware components have to be reprogrammed each time the setup time is varied.

On the other hand, this is a time-consuming process which has to be carried out by the test execution processor at run-time, i.e., during the actual test. Further processing time has to be spent for reformatting and other more or less administrative functionality. The reason therefor is that, for the convenience of the user, the actual values entered by the operator are often not the values required by the hardware. For example, the operator may enter a timing with reference to the device clock, whereas the value required by the hardware has to be expressed with reference to the system clock. Another example is that the high-level description often makes use of symbolic variables which have to be replaced by actual values or addresses before execution.

Thus, the high-level description and on-line execution of the test procedure as such is only suited for value tests where overall test time is not critical; however, it provides no solution for pass/fail tests at the production level. One could, of course, design the high-level procedure such that it also meets the requirements of a pass/fail test; however, this would not solve the test time problem.

The present invention provides a unique solution to the underlying problem which preserves the flexibility of a high-level test description, but still enables the user to run very fast pass/fail tests, without the laborious prior art approach. This goal is achieved by a combination of features which can be summarized as follows:

The symbolic test data provided by the operator are used to describe a value test, as well as a pass/fail test. This is easy, just because a value test can be seen as the repeated execution of a pass/fail test: Each time the pass/fail test is passed, it is repeated with another parameter until the test finally fails.

Now, the symbolic test data relating to the description of the pass/fail test (but not the loop which makes the pass/fail test a full-flashed value test) is transformed into executable pass/fail test data. This may happen at load-time or in any other "off-line" mode, i.e., prior to any execution of the test. One could characterize this operation as some kind of "compilation" (although the underlying functionality is not exactly that of a compiler).

However, the testing apparatus still keeps the original test data in symbolic form. That is, the description of the test procedure is now kept twice: One symbolic, easy-to-edit, but slow form suited to perform a value test or a pass/fail test (it is also possible to adapt this symbolic form to value tests only), and another executable, fast form suited to perform a pass/fail test only (which can virtually no longer be modified). However, the two forms of the test procedure still correspond to each other.

As soon as an actual test is started, control is passed to the test execution processor which may either use the executable pass/fail form of the test procedure, or the symbolic description. Which form is used depends on user instructions. In a preferred embodiment, the user instruction is entered on an on-line basis just prior to the start of a test, or even while the test is running. However, it will be appreciated that the user instruction could also be part of a batch file or another program, or entered at an earlier point in time and retrieved at run-time etc.

If the user has chosen the pass/fail form of the test procedure, the test execution processor will use the corresponding executable form, in order to perform a fast test. This option will preferably be chosen in a production floor where speed is critical.

Otherwise (i.e., if the symbolic form has been selected), the test execution processor uses the original symbolic form. As outlined above, this is a time-consuming process which requires several steps of transformation, reformatting and other "administrative" tasks. Thus, the "symbolic" option will only be chosen in an engineering environment, or for specific critical parameters to be value tested in a production environment.

As all of said transformations. etc. are performed at run-time, i.e., during the actual test, one could use the common term "interpreter" for this mode of operation. An interpreter is, in its broadest sense, a device which translates source code into executable code at run-time. Although the expressions "source code" and "executable code" do not exactly meet the conditions in an IC tester, the term "interpreter" gives some imagination of what is happening when the "symbolic" option is executed.

The final output of the "symbolic" option is still executable test data; however, these are generated at run-time, rather than at load-time. This makes it easy to modify parameters during test execution, and thus this option is particularly suited to perform value tests. However, as noted above, the "kernel" of a value test is still a pass/fail test, and thus the operator has still the option to use the "symbolic" option to perform a pass/fail test (although at lower speed than in the "executable pass/fail" case)! This is another outstanding advantage of the present invention—the engineering program may be used to perform values tests as well as pass/fail tests, and the decision on the kind of test can even be made at run-time ! In a preferred embodiment, a decision controller is included which performs a value test, or a pass/fail test, respectively, in response to user instructions or command file inputs.

Any modification of the test data (e.g., test instructions, parameters, timing information, test vectors, voltage levels etc.) is very easy to perform. In such case, the operator returns to the entry step, i.e., the modified data are entered in symbolic form. The transformation processor then transforms the revised symbolic test data (insofar as they relate to the pass/fail test) into (revised) executable test data, and both representations are kept in the testing apparatus. It is therefore ensured that both representations always reflect the latest modifications and correspond to each other.

The invention provides thus a testing apparatus which is able to perform pass/fail tests at high speed (production tests), as well as easy-to-modify value tests (engineering tests). Both tests are equivalent to each other, and no substantial amount of engineering time has to be spent therefor. This is why the invention can be characterized as "automatic high-throughput optimizer". Likewise, it is easy to integrate high-level tools, such as a graphical editor. Another high-level tool particularly suited for use in combination with the present invention are so-called "test functions". These are utilities provided by the manufacturer of a tester which already contain the basic instructions necessary to perform a value test—the customer (operator of a tester) has simply to replace or modify the parameters of such test functions.

It is understood that the actual full-flashed overall test of a device, whether in an engineering environment or a production environment, comprises a multiplicity of individual tests as described above. For example, in the case of an integrated circuit, the DC characteristics such as supply voltage or leakage current may be tested, as well as various AC characteristics (e.g., propagation delay time or setup time). Another kind of test is the so-called "functional test", i.e., a test which checks for correct operation of a device (a common example is digital circuitry; say, an adder or a logic gate. The functional test cares for the correct result in the adder, or the correct logic output of the gate).

The invention permits to combine such tests in any arbitrary manner. One particular advantage is that even fast pass/fail tests and value tests, i.e., tests of different structure, may be combined in the overall test procedure. An example is an overall production test: Whereas such a test will usually be composed of a multiplicity of pass/fail tests (just for reasons of speed, as explained above), it may be desirable to determine the exact point of failure for one or two critical parameters. The invention permits to integrate the value test necessary therefor into the overall test procedure, although all other tests are pass/fail tests. In other words, pass/fail tests and value tests can be easily "mixed".

Preferably, the testing apparatus according to the invention includes a download processor for downloading executable test data into the test data memory. This download processor may be invoked by different utilities and other processes, and at different points in time. For example, it is useful to load the executable test data describing the pass/fail test into the tester-dedicated "front end" memory (e.g., the Vector Memory or the Waveform Memory) as soon as the symbolic test data have been transformed by the transformation processor, as described above. That is, the executable test data are loaded into the test data memory just after their generation, such that they can immediately be used when a test is started.

However, download of the executable test data has not necessarily to be effected immediately after their generation. According to another solution, they may also be downloaded at the point in time when the user has selected execution of the fast pass/fail test. Although the executable data are then downloaded just prior to test execution, i.e., just before run-time, no substantial amount of time is lost. This is because the download process has only to be performed once, i.e., prior to the test of the first device. For further devices to be tested, no additional download is required, such that overall testing time is not considerably increased. On the other hand, download of the executable test data just prior to run-time has other related advantages: For example, no space in the test data memory has to be spent unless executable test data are actually required. Another advantage of the latter solution is that the download processor may perform additional tasks.

It will be understood from the foregoing that the download processor may also be used to download executable test data which have been generated on-line, i.e., during a value test when symbolic test data are transformed into executable test data. The download processor is then invoked by the test execution processor.

One specific preferred embodiment of the invention deserves further consideration. According to this embodiment, the transformation processor pre-compiles the part of the symbolic test data which relates to the pass/fail test from a high-level description into precompiled machine instructions. (That is, the term "executable test data" or "executable pass/fail test data" as used in the claims and the description does not necessarily mean that such data are ready for loading into the test data memory. In contrast, these expressions also cover cases wherein a further step of "compilation" or "interpretation", or other reformatting measures, may be necessary).

The above pre-compilation includes all steps necessary to transform the symbolic test data into a "precompiled" code which directly describes operation of the assigned hardware; however, it makes still use of symbols such as labels, or decimal numbers. That is, the precompiled code does not use the actual hardware register addresses, but labels instead, and the content of registers or memory cells is described by decimal or symbolic numbers, instead of the binary code which is finally loaded in such registers or memory cells.

The above concept has the advantage that the test execution processor may still operate on the basis of labels, instead of register addresses, such that its operation is more transparent for the operator. Yet another advantage is that operation of the test execution processor is widely independent of the actual hardware used. That is, the driver which transforms the precompiled code into definitely executable test data ("hardware driver") may easily be exchanged once another hardware embodiment is used, without necessitating any changes in the test execution processor.

However, it will be understood that the symbolic test data relating to the pass/fail test may also be directly translated into hardware-executable form.

In yet another advantageous embodiment of the invention, the test execution processor includes a repeat controller set up to repeat the above features (6.1) or (6.2), respectively, provided further electronic devices to be tested are available. This feature is of importance if a multiplicity of devices are to be tested in sequence. It also shows that, in case of the fast pass/fail test, no further test data have to be loaded into the test data memory, thus considerably increasing the speed of testing.

From the foregoing description, the reader will already be aware that one essential prerequisite, and thus a design goal, of electronic testing equipment of the kind disclosed herein is to reduce the amount of "loading" operations, i.e., transfer of data into the test data memory. Any reduction of loading operations is a substantial contribution to the speed of the tester.

One preferred and most advantageous embodiment of the present invention deals with this aspect. According to this embodiment, the testing apparatus includes at least one parameter set of executable test data which is at least partially loaded into the test data memory prior to any test, and wherein essentially all of the executable test data generated according to features (2), (4) and (6.2) represent a modification of said parameter set.

The above "parameter sets" represent some kind of a standard configuration which is useful in most practical tests. They are already loaded into the test data memory in advance, and any of the operations performed by the transformation processor or the test execution processor produces only modifications of a parameter set. That is, if we consider this specific embodiment, all of the executable test data (whether related to the fast pass/fail test or not) mentioned herein means only modification data; e.g., the transformation processor will not generate all of the executable test data required to perform a pass/fail test, but rather data which do not correspond to the parameter set, and only such modifications will then be loaded into the test data memory. This concept saves an enormous amount of testing time, particularly in case of a value test, wherein the test data memory has to be reloaded repeatedly during the performance of a test.

It will be appreciated that not only a single parameter set may be used. Instead, it is advantageous to provide a multiplicity of parameter sets (as long as there is sufficient space in the test data memory), and the test execution processor may switch between the various parameter sets during or prior to test execution, just by providing another start address in the test data memory.

The process of modifying a pre-loaded parameter set may be performed in different ways. One obvious solution is to overwrite the data in the test data memory subject to modification. However, this solution has several drawbacks. First, it could require a time-consuming reorganization of the test data memory in some instances. Second, once a data set is overwritten, it can no longer serve as a basis for further modifications.

These drawbacks are overcome by yet another advantageous embodiment of the invention, according to which the parameter set of executable test data is stored in one memory area of the test data memory, and the executable test data generated according to features (2), (4) and (6.2) are stored in another area of the test data memory. It is thus possible to preserve the original parameter set, although modifications have been made. The concept of "parameter sets" and "modifications" may even be expanded; the test data memory will then contain several parameter sets, as well as several modifications.

It has already been mentioned that the invention is particularly useful for an IC tester. However, those skilled in the art will immediately recognize that the underlying concept is of equal utility for other testers of electronic devices such as wafer testers, board testers (whether for loaded or unloaded boards) etc.

The invention also relates to a method for testing electronic devices by means of a testing apparatus including the steps of:

(1) entering test data in at least partially symbolic form, wherein said symbolic test data describe a value test, as well as a pass/fail test, (2) transforming the part of said symbolic test data which relates to the pass/fail test into executable pass/fail test data before a test is started, (3) retaining the executable pass/fail test data generated in step (2), as well as the original symbolic test data, (4) effecting, in response to user instructions, either (4.1) execution of the executable pass/fail test data generated in step (2), or (4.2) transformation and execution of said original symbolic test data during the test.

It is understood and expressly noted that the present invention relates to all useful and novel combinations of the above disclosed features, whether alone or in any other or arbitrary combination.

BRIEF DESCRIPTION OF THE DRAWINGS

The invention will now be explained, by means of a nonlimiting example, with reference to the accompanying drawings, in which.

DETAILED DESCRIPTION OF THE PREFERRED EMBODIMENT

Figure 1:
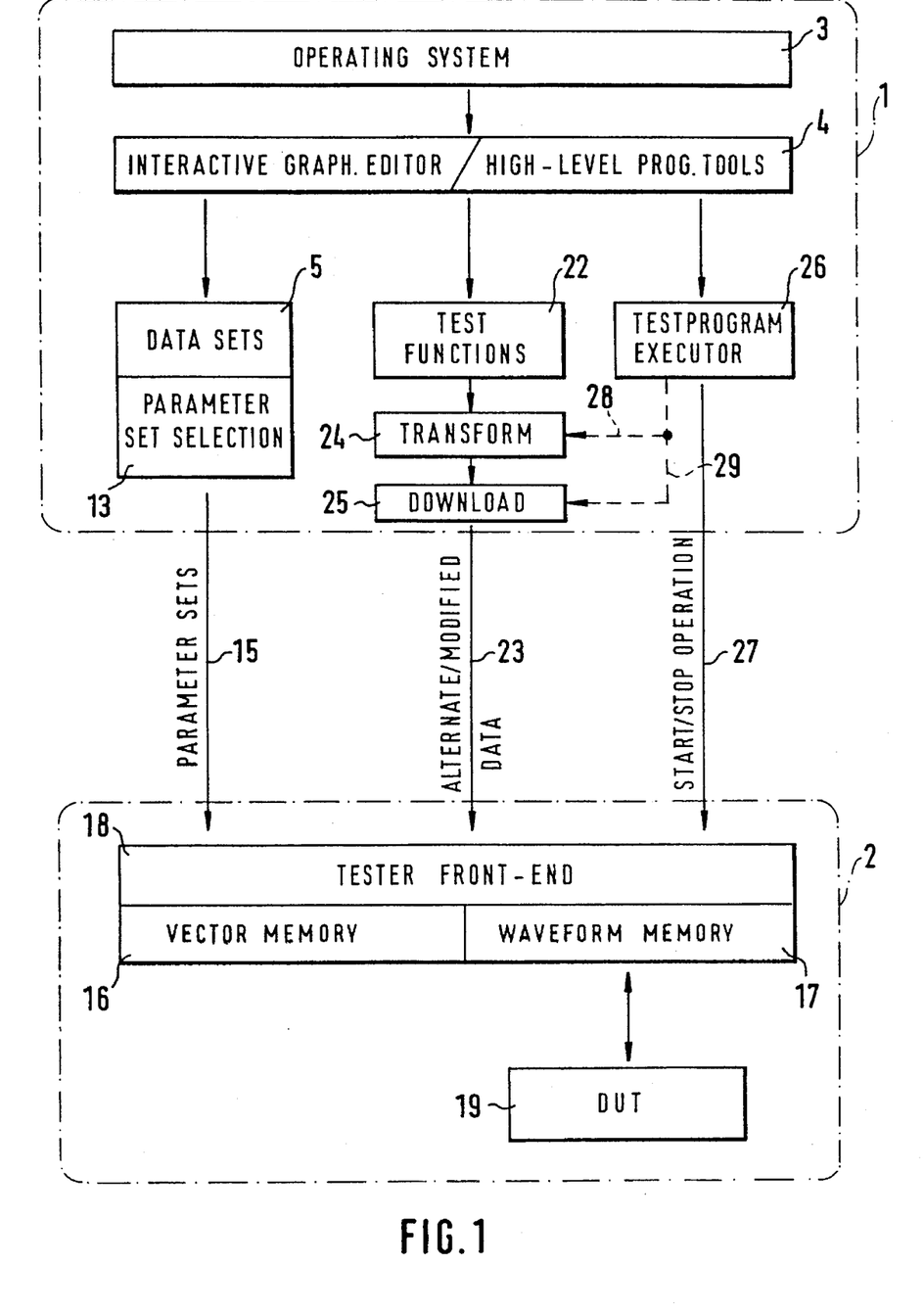
FIG. 1 depicts the major elements of an IC tester, insofar as of importance for the present invention.

FIG. 1 is a block diagram representation of an integrated circuit tester according to the present invention. However, this diagram is of quite general form and does not depict all details of the implementation of the invention; in this respect, reference is made to FIG. 5.

A first block of elements is drawn in a dotted box 1. This box constitutes the program control device (typically, it is a computer of the size and speed of a workstation running under a general-purpose operating system, but with several special enhancements which make it suited for test control).

The second dotted box 2 contains tester-dedicated hardware components. This circuitry is suited to generate the high-precision timing and logic signals required for a test, such as edge generators and formatters, as well as circuits adapted to measure the response of a device under test (DUT), such as comparators. Sometimes (although not in the preferred embodiment disclosed herein), the tester hardware is even physically separated from program control device 1.

As already mentioned, program control device 1 operates under control of a general-purpose operating system 3, such as UNIX®. The operating system runs a set of application programs 4 which support the user upon data entry, test control etc. Two major application programs of interest herein are an interactive graphical editor, as well as other high-level programming tools which permit the user to define the test flow in symbolic expressions, but without directly dealing with the hardware environment (hardware addresses, register contents etc.).

Program control device 1 further includes several so-called data sets 5. These are collections of or references to parameters sets; the parameter sets are, in turn, test specifications as e.g. timing information, voltage level information etc. suited for downloading into the tester-dedicated hardware components. For further explanation of the term "data set", reference is made to FIG. 2 which depicts a typical screen image of the interactive graphical editor as it is used to define a test.

Figure 2:
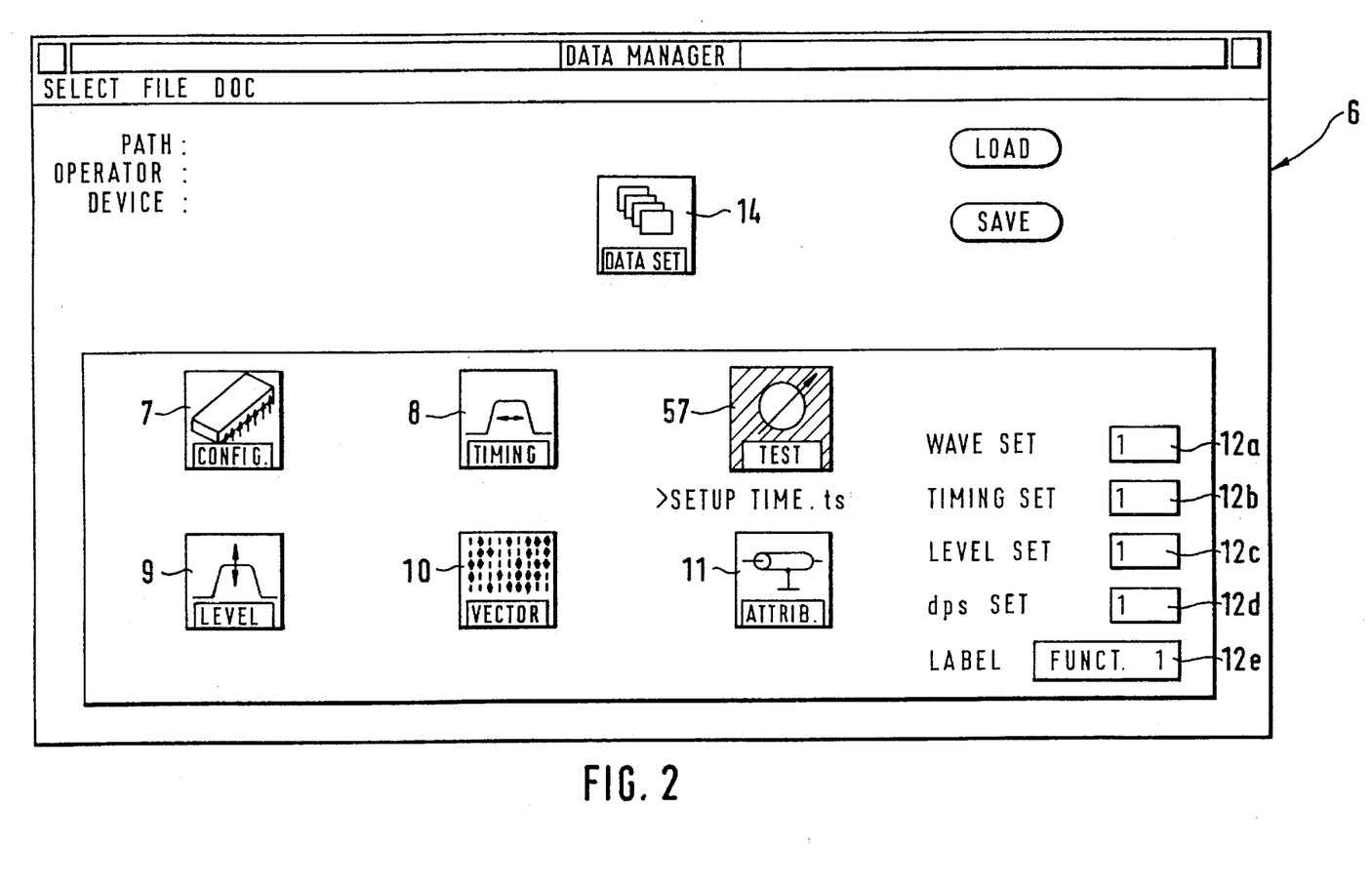
FIG. 2 is an example of a graphical editor used to define the parameters of a test.

Screen 6 depicts five symbols representing the elements which make up a complete data set. The first one is the "configuration" item 7. The configuration facility contains the cross-references between the pins of a specific IC under test in terms of their pin number and/or their logical symbols and the assigned tester channels. For example, channel no. 5 may be designated as address pin 1 ("A1"), such that further reference to this pin may be made as "A1". It is understood that this cross-reference list has to be provided by the user.

Other items in a data set are the "timing" facility 8 (information such as transition times, pulse widths etc.), "level" facility 9 (voltage and current levels), "vector" facility 10 (test sequences stored in the Vector Memory) and "attribute" facility 11 (other features of interest such as the characteristic impedance). In order to make life easier for the user, the latter facilities are typically provided as "sample" facilities by the manufacturer of the tester. The user may modify these facilities by simply clicking on the corresponding symbol. In response thereto, the tester enters an editing mode which permits the user to modify the selected facility according to his demands.

A data set may contain more than one facility of each kind. For example, 3 wave sets ("vector" facility 10), and/or 5 timing sets ("timing" facility 8) may be included in the same data set. Thus, the user has to select one facility of every kind before a test can be performed. Entry fields 12a to 12e are provided for this purpose. The latter step is also designated as "Parameter Set Selection", see ref. no. 13 in FIG. 1.

In order to ensure proper operation of a device under test, a multiplicity of individual tests (e.g., functional test, DC tests, AC tests) have to be performed. The user may select the appropriate facilities, i.e., the parameter sets, for each individual test, and the totality of all individual tests makes then up the overall test. Likewise, the user has access to a multiplicity of data sets, see symbol 14 in FIG. 2, in order to test different devices.

Returning now to FIG. 1, the parameter sets selected by the user are loaded from program control device 1 into the tester-dedicated hardware, as illustrated by arrow 15, preferably under control of the test execution program just before execution of the first test. FIG. 1 depicts particularly Vector Memory 16 and Waveform Memory 17 (the entirety of these memories is also designated as "test data memory" in this description). The remainder of the tester-dedicated hardware components, such as the edge generators, are included in "Tester Front-End" box 18. Just as an example, data included in "VECTOR" set 10 are loaded into Vector Memory 16, whereas data included in "TIMING" set 8 are loaded into Waveform Memory 17. For a more detailed description of the functionality provided by Vector Memory 16 and Waveform Memory 17, And the way these memories communicate with the device under test 19, reference is made to EP-A-541 839.

Figure 3:
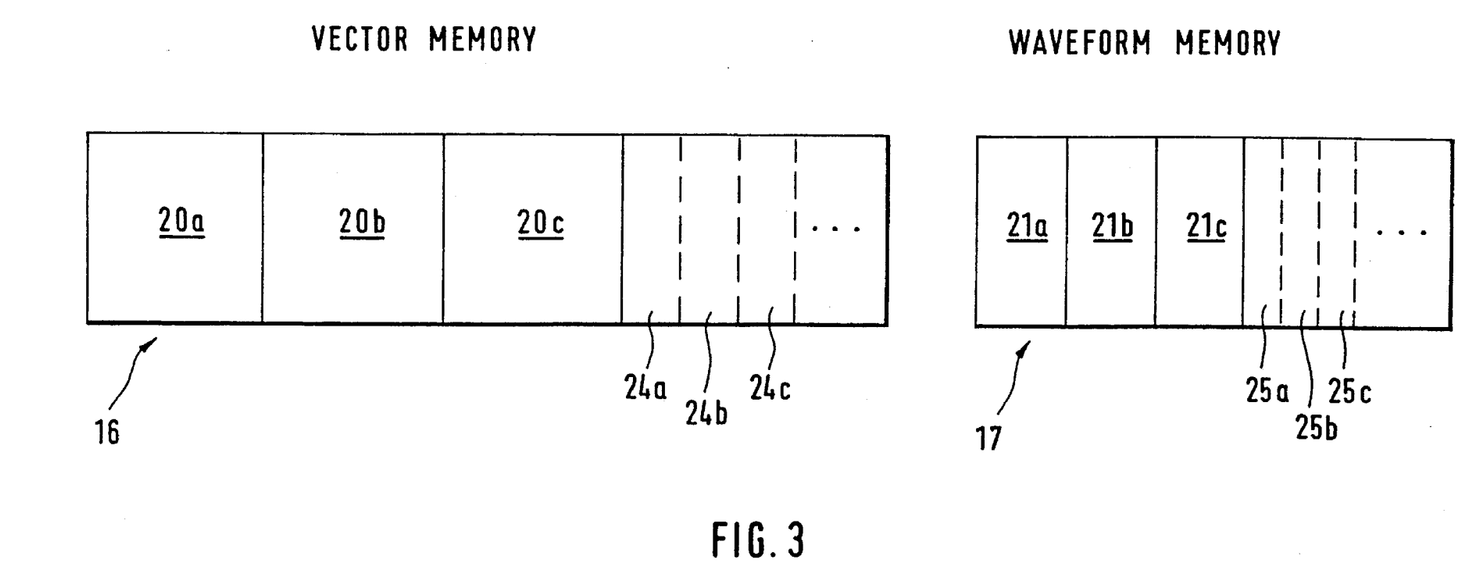
FIG. 3 shows the organization of the test data memory.

In order to increase testing speed, as much data as possible is already loaded from the program control device into the tester-dedicated hardware (just) prior to execution of a test (whereas execution in the hardware components is very fast, any download from the program control device to the tester hardware is quite time-consuming). FIG. 3 depicts in an exemplary embodiment the organization of parameter sets in the front-end memories. Vector Memory 16 contains several parameter sets 20a, 20b and 20c in sequential order, whereas Waveform Memory 17 contains other parameter sets 21a, 21b and 21c, also arranged in sequential order. Program control device 1 retains the start addresses of the various parameter sets, such that they are easy to access upon execution of a test. Preferably, the program control device keeps also symbols for the start addresses such that the user may handle them easily (cf. label 12e in FIG. 2); it is even possible to execute only part of a parameter set using symbolic addresses.

Yet another important feature of the IC tester are the so-called "test functions" 22 in FIG. 1. These are utilities provided by the manufacturer of the tester in some kind of higher language (be it a high-end language such as C++ or an assembler-like language) specifically adapted to perform a value test, i.e., a test wherein a parameter is modified until the device fails. It will be understood that such a test requires the permanent generation of new data at run-time, i.e., during execution of the test. The new or modified data have then to be downloaded into the tester-dedicated hardware, as illustrated by arrow 23. FIG. 3 shows how the modified data 24a to 24c, and 25a to 25c are stored in Vector Memory 16 and Waveform Memory 17, respectively, in sequential manner. The modified data are appended to the parameter sets such that the latter are not overwritten. Thus, they are still operative for further tests. Alternatively, one could also choose the approach of overwriting, but still keeping the original parameter sets on disk or the like, such that they can easily be restored.

Although primarily provided for the execution of value tests, the test functions may also be used to perform a pass/fail test. This is just because these tests are similar to a large extent. That is, the test of a certain value of an individual parameter is the same in both cases. However, the pass/fail tests stops at this point, indicating whether the device has passed or failed the test. In contrast, if a value test is performed, the test is restarted with another value of the parameter if the test has been passed.

Anyway, the test functions cannot be directly executed, regardless whether a value test or a pass/fail test is conducted. Instead, the test functions need to be transformed into executable test data, e.g., by transformation processor 24. After transformation, they are loaded into Vector Memory 16 or Waveform Memory 17, respectively. A download processor 25 is provided for this purpose. The test functions may also be accessed by the operator of the tester, see ref. no. 57 in FIG. 2.

It will be appreciated that such transformation is a time-consuming process. If performed repeatedly during a test, the throughput is drastically reduced such that the tester is no longer suited for a production environment. On the other hand, the test functions cannot be provided in transformed form only, just because they do not completely fit into the tester-dedicated hardware, and because they could then no longer be modified by the user (which is an essential prerequisite for value tests and also for most pass/fail tests). The manner in which the present invention overcomes this problem will be discussed later with reference to FIG. 5.

The actual test is performed under control of a test program executor 26 which runs in program control device 1. The test program executor permits to define the test conditions in an interactive mode, or via a batch file, and starts the test data stored in Vector Memory 16 and Waveform Memory 17 at predefined addresses (labels), see ref. no. 27. In some cases, the test program executor also controls operation of transformation processor 24, and download processor 25 (by performing a "call" to the test functions), as will be described below (ref. nos. 28, 29).

Figure 4:
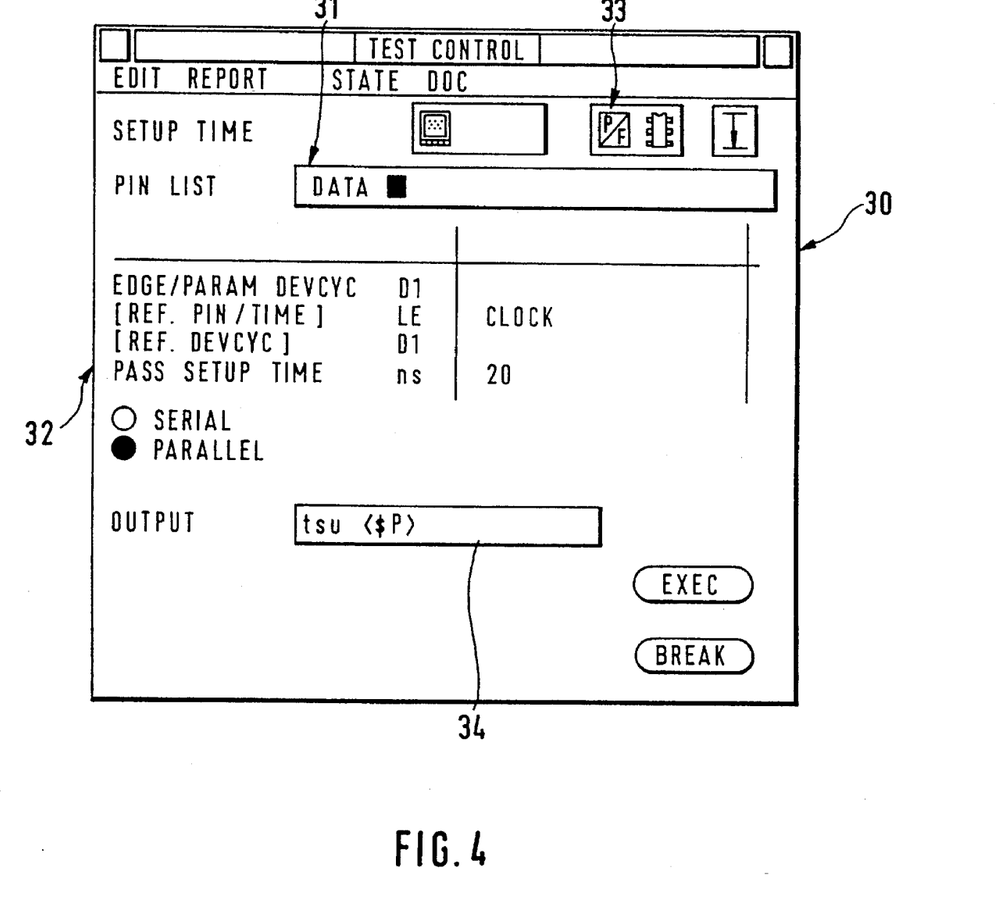
FIG. 4 depicts the editing window of a test function.

FIG. 4 depicts a typical editing window 30 of the test function utility. This editing window permits the user to select several settings of the test, such as the pins to be tested (ref. no. 31), or the conditions for pass/fail (ref. no. 32). However, what is most important is that the user still has the choice between a fast pass/fail test and a value test, even at this point in time (ref. no. 33).

The test function editing window 30 includes also a field 34 for selection of a string to be provided with the results of a test (actually, the result is either logged in a file, or shown in a different window). In case of a pass/fail test, this will be a simple indication whether the test has been passed or not. However, in case of a value test, the value at which the device has failed will be displayed.

It will be appreciated that the display of test executor editing window 30 is only useful when a test procedure is being created. In a production test, this window will be skipped, and the necessary information will be provided on an automatic basis.

Figure 5:
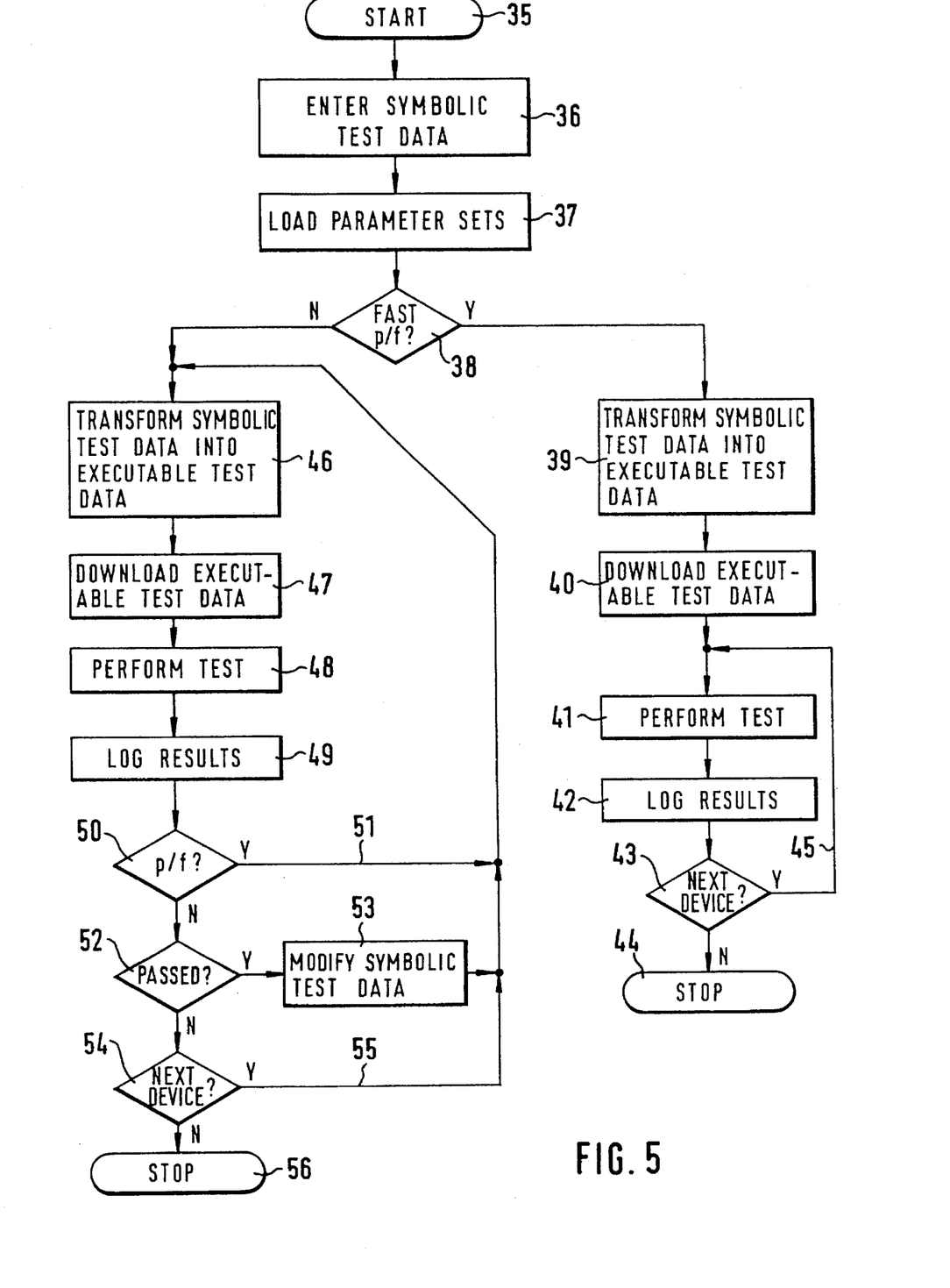
FIGS. 5 and 6 are flowcharts illustrating the basic mode of operation according to the present invention.

The flowchart of FIG. 5 depicts the basic flow of operation in a tester according to the present invention. The flowchart is entered at "START" label 35.

In step 36, the user is requested to enter the symbolic test data, e.g., via screen 6 (FIG. 2). It will be appreciated that this step may also be skipped if the necessary information has already been provided to the tester. The parameter sets—i.e., the "standard" definitions —, are then loaded from the program control device into the test data memory (step 37).

In step 38, the operator has the choice to execute either a fast pass/fail test, or a slow test (again, this information may also be provided on an automatic basis). Typically, he will choose the fast pass/fail test if a production test is to be performed.

Now let us assume that the fast pass/fail test has been selected. Operation proceeds to box 39; that is, the code of the underlying test function, insofar as relating to a pass/fail test, is transformed into executable test data and downloaded into the test data memory (step 40). It is important to note that only the part of the test function relating to the pass/fail test is transformed, whereas other functionality (as, e.g., necessary to perform additional functions for a value test) is not transformed. The transformation processor which provides this functionality (see ref. no. 24 in FIG. 1) may even perform further optimization of the test function, in order to increase operating speed.

The transformation effected in box 39 can also be characterized as some kind of "compilation" just because it is only executed once, namely prior to the test. It will be appreciated that the same functionality may be obtained if the contents of boxes 39 and/or 40 are executed at an earlier point in time, e.g., directly after box 37.

In step 41, the actual test (namely a pass/fail test) is performed. This test is very fast, just as no symbolic test data have to be transformed.

Next, the results of the test are logged (box 42), e.g., by writing the results into a file, or by producing a printout. If further DUT's are available (step 43), the test process is repeated; otherwise, operation ends or returns to the calling process (box 44).

It is important to note that the "test loop" for performing multiple tests (steps 41, 42 and 43, as well as feedback path 45) does not include the transformation of any symbolic test data. That is, devices can be tested in sequence at very high speed.

Now let us assume that the operator has denied to select the "fast pass/fail" path. Like in the preceding example, the symbolic test data are transformed into executable test data by transformation processor 24, see box 46, and downloaded into the test data memory (box 47). However, in contrast to what has been said above for the fast pass/fail test, transformation and download are effected every time the "test loop" is passed. Therefore, the underlying operation may be characterized as on-line "interpretation", rather than the compilation step discussed above.

In step 48, the test is performed (just as in step 41), and the results are logged (box 49). In step 50, a decision is made as to whether a pass/fail test, or a value test is desired. This decision can be made on an automatic, or a manual basis. In the latter case, the operator may still decide to perform a pass/fail test at a very late point in time.

It is understood that selection of a pass/fail test in step 50 does not make the underlying test suited for a production environment, just as the feedback loop (ref. no. 51) returns to step 46, namely transformation, which makes subsequent tests slower. However, there may be conditions in an engineering embodiment where even a pass/fail test may be useful.

If the operator selects the "NO" path in decision step 50, this means that he wants to perform a value test. Consequently, a check is made as to whether the test has been passed (step 52). If yes, the symbolic test data are modified (box 53), and the process returns to its start point, i.e., transformation of the (now modified) symbolic test data (step 46). It will be appreciated that a new transformation is necessary, just because the test has to be repeated with different parameters; however, the repeated transformation and download makes the process slow, such that it is primarily suited for engineering environments.

At one point in time—no matter when this occurs—, the device will fail the value test. This is the end of the value test, and operation proceeds to step 54 (which is similar to step 43). If another device to be tested is available, operation returns (ref. no. 55) to box 46; otherwise, operation ends or returns to the calling process (box 56).

The left-hand diagram in FIG. 5 does not only show that the steps of transformation and download are included in the feedback loop. It also illustrates that a value test comprises an inner "kernel" of a pass/fail test, namely boxes 48 and 49 (the additional elements unique to the value test, but not relating to the pass/fail test, are steps 52 and 53).

It will appreciated that the "tests" shown in FIG. 5 (boxes 41 and 48) may, in an actual embodiment, comprise several individual tests such as a functional test, various DC and AC tests etc. The invention even permits to mix fast pass/fail and other tests in a single test procedure, e.g., a DC test which is a pass/fail test and an AC test which is a value test. However, all these ramifications are not shown in detail in the figures. Skilled people will easily be able to implement such a structure once they have recognized the teachings of the present invention.

Likewise, it will be evident that the data loaded into the tester-dedicated hardware according to steps 40 and 47 will only be data which modify the original parameter sets. Repetitive loading of the same data is not a design goal of the present invention.

Figure 6:
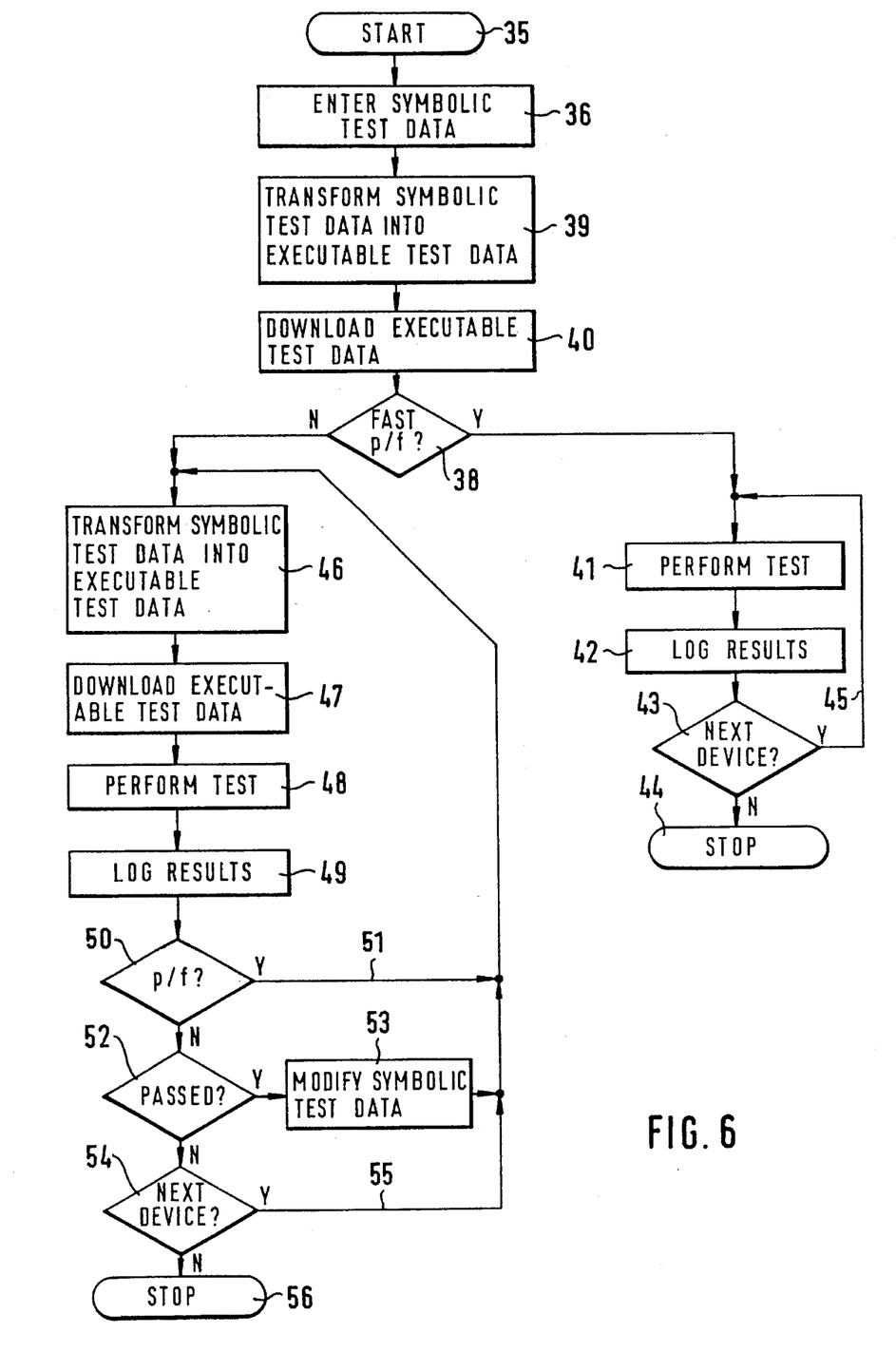

It will be appreciated that the transformation and download of executable test data may also be already performed before the decision on the fast pass/fail test is made (actually, this is the case in the most preferred embodiment of the present invention). FIG. 6 depicts this modified process flow, wherein the same reference numbers as in FIG. 5 have been used. However, one will note that the early transformation and download is only of importance for the (rightmost) fast pass/fail test path, whereas the transformations and download operations have still to be performed on-line in case of the leftmost path.

We claim:

1. Testing apparatus for testing electronic devices including a program control device and a test data memory, said testing apparatus comprising:

(1.1) An input device for entering test data and test instructions in symbolic form, hereafter referred to as symbolic test data, said symbolic test data describing a value test, as well as a pass/fail test, (1.2) a transformation processor for transforming said symbolic test data into executable test data, (1.3) a test execution processor for performing tests using executable test data stored in said test data memory, and (1.3) a hardware driver, wherein (1.4) said transformation processor transforms the part of said symbolic test data which relates to the pass/fail test into executable pass/fail test data before a test is started, and further pre-compiles said part of the symbolic test data which relates to the pass/fail test from a high level description into precompiled machine instructions, and said hardware driver, prior to a test, reformats said precompiled machine instructions into executable pass/fail test data, (1.5) said testing apparatus retains the executable pass/fail test data generated by the transformation processor according to feature (1.4), as well as the original symbolic test data, (1.6) said test execution processor causes, in response to user instructions, either:

(1.6.1) execution of the executable pass/fail test data generated by the transformation processor according to feature (1.4), or (1.6.2) transformation and execution of said original symbolic test data.

2. Testing apparatus according to claim 1 including a download processor for downloading executable test data into said test data memory.

3. Testing apparatus according to claim 2, wherein said download processor downloads said executable pass/fail test data into said test data memory after their generation by the transformation processor.

4. Testing apparatus according to claim 2, wherein said download processor downloads said executable pass/fail test data into said test data memory only when option (1.6.1) has been selected.

5. Testing apparatus according to claim 2, wherein feature (1.6.2) includes downloading of transformed symbolic test data during the test.

6. Testing apparatus according to claim 1, wherein feature (1.4) includes the compilation of said part of the symbolic test data which relates to the pass/fail test from a high-level description into executable pass/fail test data.

7. Testing apparatus according to claim 1, wherein feature (1.6.2) includes the interpretation of said original symbolic test data during the test, said interpretation causing transformation of said symbolic test data into executable code and a downloading of said executable code into a test memory.

8. Testing apparatus according to claim 1, wherein feature (1.6.2) includes a decision controller for performing, in response to user instructions or command file inputs, a value test or a pass/fail test.

9. Testing apparatus according to claim 1, wherein said transformation processor is set up to execute feature (1.4) at load-time.

10. Testing apparatus according to claim 1, wherein said test execution processor is set up to perform feature (1.6) at run-time.

11. Testing apparatus according to claim 1, wherein said test execution processor includes a repeat controller set up to repeat features (1.6.1) or (1.6.2), respectively, provided further electronic devices to be tested are available.

12. Testing apparatus according to claim 1 including at least one parameter set of executable test data which is at least partially loaded into said test data memory prior to any test, and wherein essentially all of the executable test data generated according to features (1.2), (1.4) and (1.6.2) are derived from said parameter set.

13. Testing apparatus according to claim 12, wherein said parameter set of executable test data is stored in one memory area of said test data memory, and the executable test data generated according to features (1.2), (1.4) and (1.6.2) are stored in another area of said test data memory.

14. Testing apparatus according to claim 1, wherein said input device includes a graphical interactive editor.

15. Testing apparatus according to claim 1, wherein said testing apparatus is an integrated circuit tester.

16. Method for testing electronic devices by means of a testing apparatus including the steps of:

(19.1) entering test data and test instructions in symbolic form, hereafter referred to as symbolic test data, wherein said symbolic test data describes a value test, as well as a pass/fail test, (19.2) transforming the part of said symbolic test data which relates to the pass/fail test from a high level description into precompiled machine instructions, and reformatting said precompiled machine instructions into executable pass/fail test data before a test is started, (19.3) retaining the executable pass/fail test data generated in step (19.2), as well as the original symbolic test data, (19.4) effecting, in response to user instructions, either:

(19.4.1) execution of the executable pass/fail test data generated in step (19.2), or (19.4.2) transformation and execution of said original symbolic test data and interpreting during the test the original symbolic test data so as to transform said symbolic test data into executable code and downloading said executable code into a test memory.

* * * * *